United States Patent [19]
Sawahata

[11] Patent Number: 5,932,881
[45] Date of Patent: Aug. 3, 1999

[54] SIMULATION METHOD FOR HIGH RESOLUTION DEEP IMPURITY PROFILE

[75] Inventor: Koichi Sawahata, Tokyo, Japan

[73] Assignee: NEC Corporation, Tokyo, Japan

[21] Appl. No.: 08/791,553

[22] Filed: Jan. 31, 1997

[30] Foreign Application Priority Data

Jan. 31, 1996 [JP] Japan .................................. 8-014973

[51] Int. Cl.⁶ .............................................. H01L 21/265
[52] U.S. Cl. ...................................................... 250/492.21
[58] Field of Search ........................................ 250/492.21

[56] References Cited

U.S. PATENT DOCUMENTS

| | | | |
|---|---|---|---|
| 4,410,801 | 10/1983 | Sakurai et al. ...................... | 250/492.21 |
| 5,096,841 | 3/1992 | Miura et al. ........................ | 250/492.21 |
| 5,185,273 | 2/1993 | Jasper ................................. | 250/492.21 |

FOREIGN PATENT DOCUMENTS 8-88195  4/1996  Japan .

OTHER PUBLICATIONS

Supercomputing Technology, Fuji Sogo Kenkyujo, Hei 3–8, pp. 115–116.

Analysis and Simulation of Semiconductor Device, "Ion Implantation", pp. 52–53.

"Handou–Tai Soshi Simulator (Semiconductor Device Simulator)", H. Koike et al., Fuji–Sougou Kenkyujo, Maruzen Publishing Company, Aug. 25, 1991, pp. 108–117.

"Models for Implantation into Multilayer Targets", H. Ryssel et al., *Appl. Phys.*, A 41,201–207 (1986).

*Primary Examiner*—Jack I. Berman
*Attorney, Agent, or Firm*—Sughrue, Mion, Zinn, Macpeak & Seas, PLLC

[57] ABSTRACT

In a computer-implemented simulation method for implanting ions into a semiconductor substrate, a region is defined in a vertical cross-section of the substrate between first and second horizontal lines, the first horizontal line being spaced a distance $R_p - N\sigma$ from a top surface of the substrate and the second horizontal line being spaced a distance $R_p + N\sigma$ from the top surface, where $R_p$ is a projected range of implanted ions from the top surface, N is an integer, and $\sigma$ is a standard deviation of horizontal spread of an impurity profile. An orthogonal coordinate system is then defined by a set of narrowly spaced horizontal parallel lines within the region, a set of widely spaced horizontal parallel lines outside of the region and a set of vertical parallel lines at spacing which increases as a function of distance from opposite vertical edges of the coordinate system. A simulation of ion implantation is performed into the substrate and an impurity profile is obtained using the coordinate system.

17 Claims, 3 Drawing Sheets

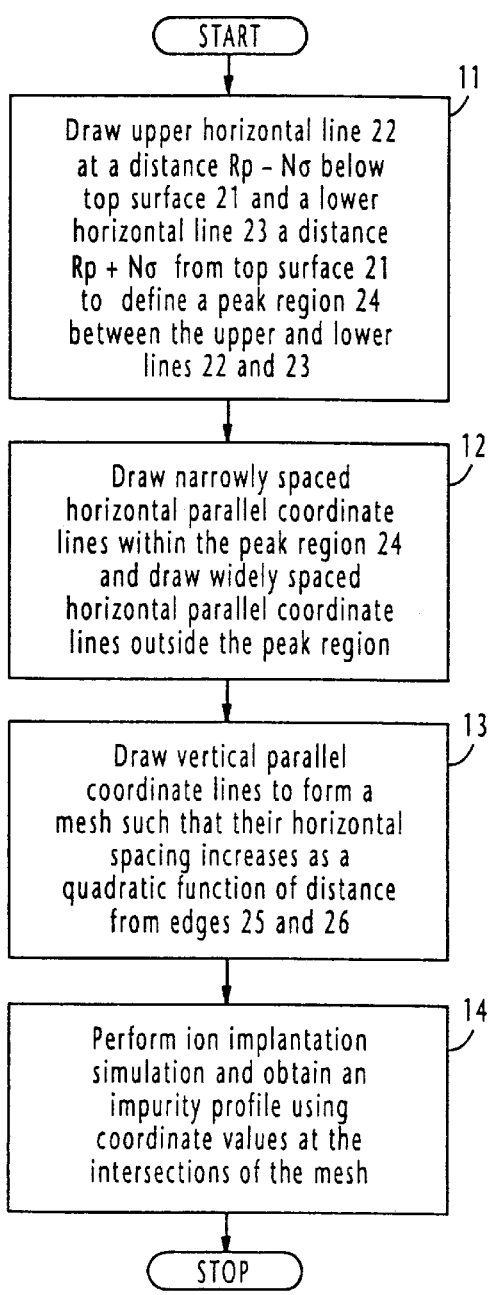
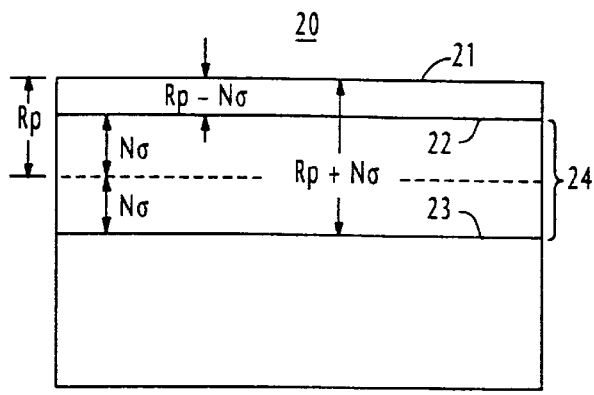
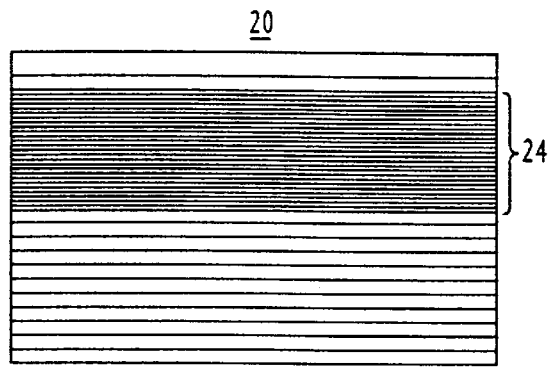
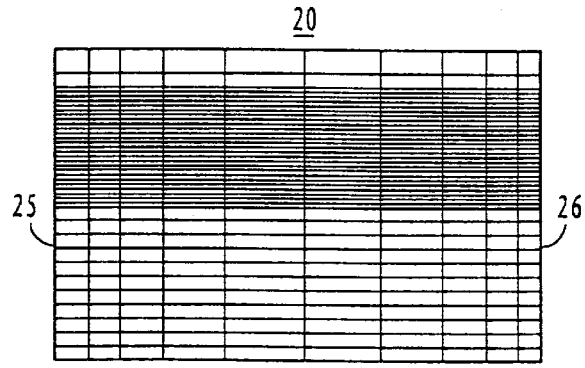

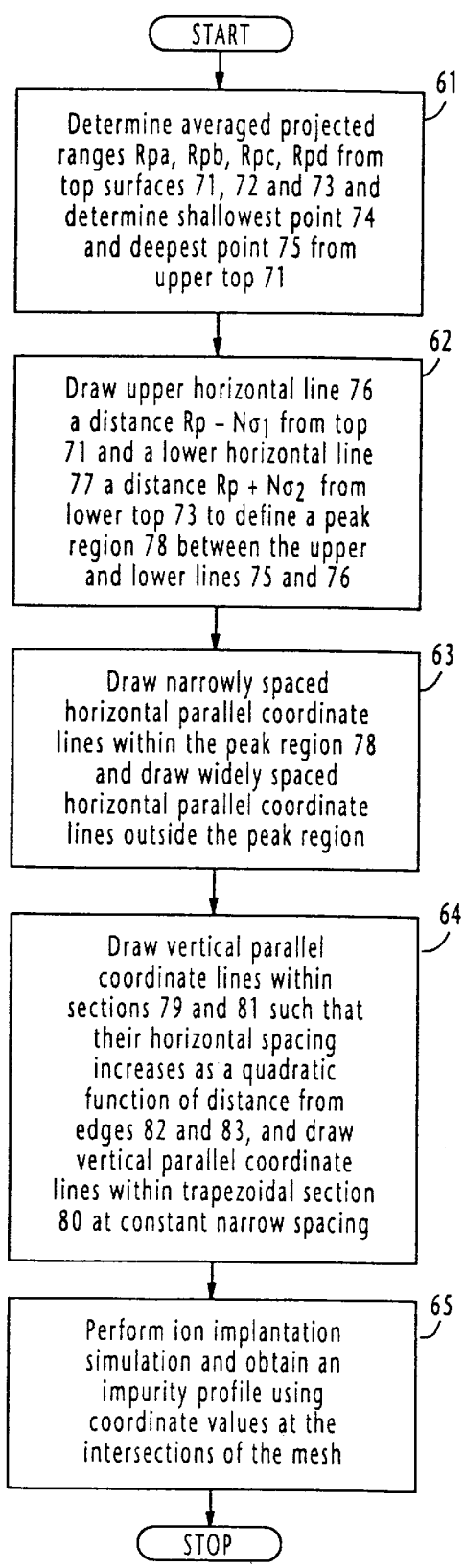

FIG. 5

START

61 — Determine averaged projected ranges Rpa, Rpb, Rpc, Rpd from top surfaces 71, 72 and 73 and determine shallowest point 74 and deepest point 75 from upper top 71

62 — Draw upper horizontal line 76 a distance $Rp - N\sigma_1$ from top 71 and a lower horizontal line 77 a distance $Rp + N\sigma_2$ from lower top 73 to define a peak region 78 between the upper and lower lines 75 and 76

63 — Draw narrowly spaced horizontal parallel coordinate lines within the peak region 78 and draw widely spaced horizontal parallel coordinate lines outside the peak region 64 — Draw vertical parallel coordinate lines within sections 79 and 81 such that their horizontal spacing increases as a quadratic function of distance from edges 82 and 83, and draw vertical parallel coordinate lines within trapezoidal section 80 at constant narrow spacing 65 — Perform ion implantation simulation and obtain an impurity profile using coordinate values at the intersections of the mesh

STOP

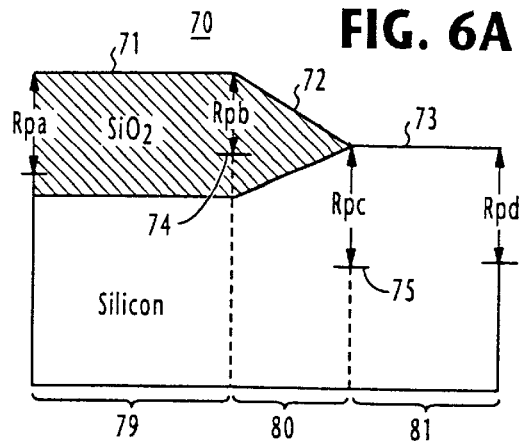

FIG. 6A

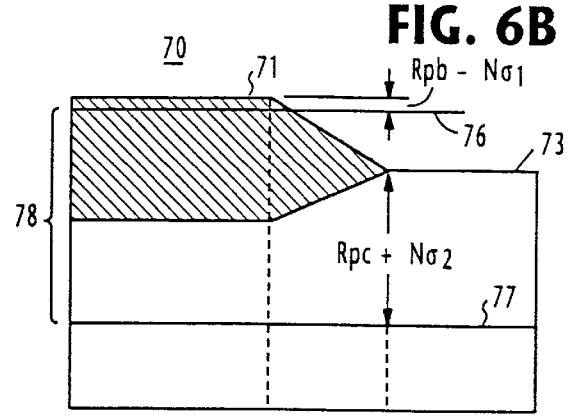

FIG. 6B

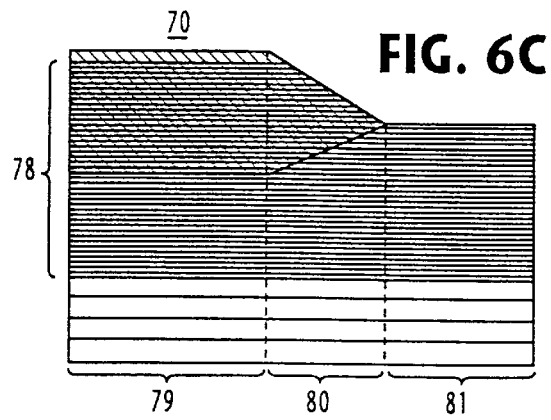

FIG. 6C

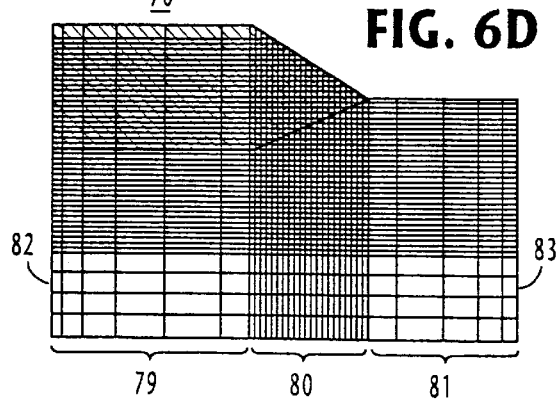

FIG. 6D

SIMULATION METHOD FOR HIGH RESOLUTION DEEP IMPURITY PROFILE

BACKGROUND OF THE INVENTION

1. Field of the Invention

The present invention relates generally to computer implemented simulation methods for ion implantation into semiconductor substrates, and more specifically to the generation of a mesh in a cross-section of a semiconductor substrate to define an orthogonal coordinate system.

2. Description of the Related Art

According to a known computer-implemented method for ion implantation simulation, a mesh is generated to define an orthogonal coordinate system in a vertical cross-section of a simulated semiconductor substrate. As described in "Handou-Tai Soshi Simulator (Semiconductor Device Simulator)", H. Koike et al., Fuji-Sougou Kenkyujo, Maruzen Publishing Company, Aug. 25, 1991, pages 115 and 116, the horizontal parallel lines of the mesh are drawn such that those immediately below the flat top surface of a silicon substrate are spaced narrower than those in a deeper region of the substrate. The vertical parallel lines of the mesh are drawn such that those near mask edges are spaced narrower than those inside the substrate since the impurity profile near the mask edges varies violently and so it must be defined with high resolution. Simulation of ion implantation is then performed and the meshed coordinate system is used to produce an impurity profile.

While satisfactory for low energy applications, the spacing of the horizontal parallel lines in the substrate's deeper region is too coarse to give a high definition of an impurity profile, particularly its peak region, when high energy is used for implantation of ions.

SUMMARY OF THE INVENTION

It is therefore an object of the present invention to provide high resolution simulation method for high energy ion implantation.

According to a broader aspect of the present invention, there is provided a computer-implemented simulation method for ion implantation into a semiconductor substrate. The method comprises steps of:

a) defining a region in a vertical cross-section of the substrate between first and second horizontal lines, the first horizontal line being spaced a distance $R_p - N\sigma$ from a top surface of the substrate and the second horizontal line being spaced a distance $R_p + N\sigma$ from the top surface, where $R_p$ is a projected range of implanted ions from the top surface, N is an integer, and $\sigma$ is a standard deviation of horizontal spread of an impurity profile;

b) forming an orthogonal coordinate system by drawing a plurality of narrowly spaced horizontal parallel lines within the region and a plurality of widely spaced horizontal parallel lines outside of the region and a plurality of vertical parallel lines at spacing which increases as a function of distance from opposite vertical edges of the coordinate system; and c) performing implantation of ions into the substrate through the top surface and determining an impurity profile using the coordinate system.

According to a second aspect, the present invention provides a computer-implemented simulation method for ion implantation into a single-layer semiconductor substrate having an upper top surface, a slope shelving from the upper top surface to a lower top surface and defining first and second rectangular sections below the upper and lower top surfaces, respectively, and a trapezoidal section below the slope, the method comprising the steps of:

a) defining a region in a vertical cross-section of the substrate between first and second horizontal lines, the first horizontal line being spaced a distance $R_p - N\sigma$ from the upper top surface and the second horizontal line being spaced a distance $R_p + N\sigma$ from the lower top surface, where $R_p$ is a projected range of implanted ions from the top surface, N is an integer, and $\sigma$ is a standard deviation of horizontal spread of an impurity profile;

b) forming an orthogonal coordinate system by drawing a plurality of narrowly spaced horizontal parallel lines within the region and a plurality of widely spaced horizontal parallel lines outside of the region, a plurality of first vertical parallel lines within the first rectangular section at spacing which increases as a function of distance from a vertical edge of the coordinate system, a plurality of second vertical parallel lines within the second rectangular section at spacing which increases as a function of distance from an opposite vertical edge of the coordinate system, and a plurality of third vertical parallel lines within the trapezoidal section at equal spacing; and c) performing implantation of ions into the substrate through the upper top surface, slope and lower top surface and determining an impurity profile using the coordinate system.

According to a third aspect, the present invention provides a computer-implemented simulation method for ion implantation into a partially multi-layered semiconductor substrate having an upper top surface, a slope shelving from the upper top surface to a lower top surface and defining first and second rectangular sections below the upper and lower top surfaces, respectively, and a trapezoidal section below the slope, the first rectangular section and the trapezoidal section including first and second layers, the method comprising the steps of:

a) defining a region in a vertical cross-section of the substrate between first and second horizontal lines, the first horizontal line being spaced a distance $R_{p1} - N\sigma_1$ from the upper top surface and the second horizontal line being spaced a distance $R_{p2} + N\sigma_2$ from the lower top surface, where $R_{p1}$ is a projected range of implanted ions from the upper top surface, $R_{p2}$ is a projected range of implanted ions from the lower top surface, N is an integer, $\sigma_1$ is a standard deviation of horizontal spread of an impurity profile in the first layer, and $\sigma_2$ is a standard deviation of horizontal spread of the impurity profile in the second layer;

b) forming an orthogonal coordinate system by drawing a plurality of narrowly spaced horizontal parallel lines within the region and a plurality of widely spaced horizontal parallel lines outside of the region, a plurality of first vertical parallel lines within the first rectangular section at spacing which increases as a function of distance from a vertical edge of the coordinate system, a plurality of second vertical parallel lines within the second rectangular section at spacing which increases as a function of distance from an opposite vertical edge of the coordinate system, and a plurality of third vertical parallel lines within the trapezoidal section at equal spacing; and c) performing implantation of ions into the substrate through the upper top surface, slope and lower top surface and determining an impurity profile using the coordinate system.

BRIEF DESCRIPTION OF THE DRAWINGS

The present invention will be described in further detail with reference to the accompanying drawings, in which:

FIG. 1 is a flowchart of a computer-implemented simulation method for ion implantation on a flat-top, single-layer semiconductor substrate according to a first embodiment of the present invention;

FIGS. 2A to 2C are vertical cross-sections of a computer model of the substrate of FIG. 1;

FIG. 5 is a flowchart of a computer-implemented simulation method for ion implantation on a nonflat-top, partially two-layered semiconductor substrate according to a third embodiment of the present invention; and FIGS. 6A to 6D are vertical cross-sections of a computer model of the substrate of FIG. 5.

DETAILED DESCRIPTION

Figure 3:
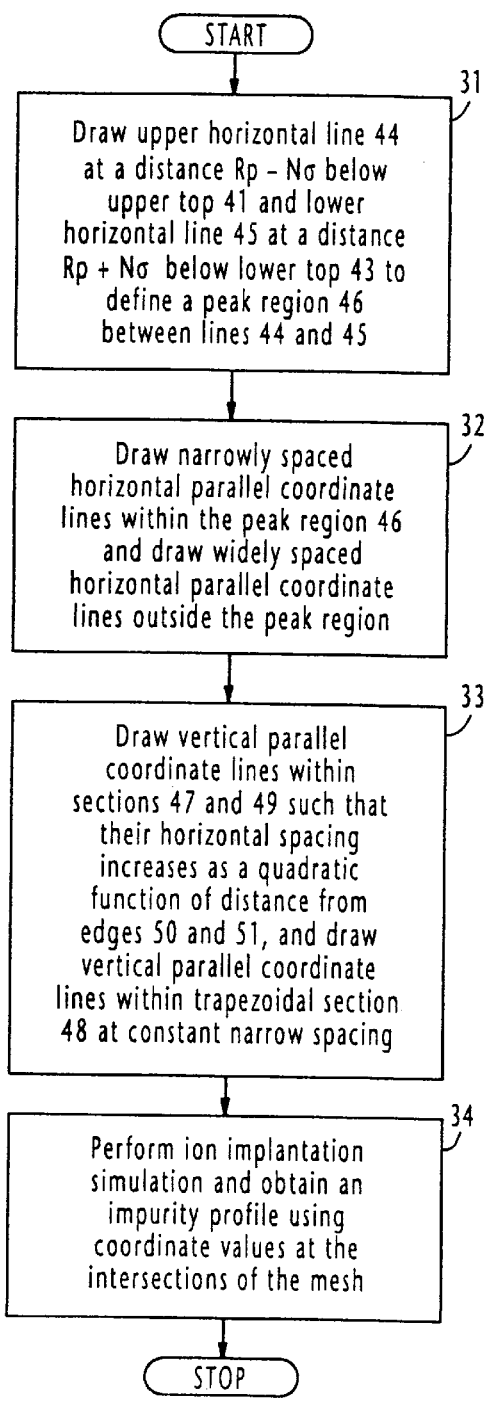
FIG. 3 is a flowchart of a computer-implemented simulation method for ion implantation on a nonflat-top, single-layer semiconductor substrate according to a second embodiment of the present invention.

Before describing the present invention, it is useful to explain distribution of impurities implanted in a semiconductor substrate. As described in "Analysis and Simulation of Semiconductor Devices", Siegfried Selberherr Springer-Verlag, page 52, 1984, a distribution of impurities is obtained by a Gaussian distribution, a joined half Gaussian distribution and Pearson distribution using parameters $R_p$ (projected range representing an average depth of impurities distributed in a semiconductor substrate), $\Delta R_p$ (standard deviation of the lateral spread of distributed impurities), $\gamma$ (skewness of the distribution) and $\beta$ (kurtosis representing the peakedness of the distribution). These parameters are known as "moments" which are used to define the impurity distribution of a semiconductor substrate. These moments are usually measured on various sets of implantation energies, doses, substrate materials, and impurities, and thus available on the market. When a computer simulation is performed on a semiconductor substrate, these moments can be readily available from a substrate material to be used for simulation.

A joined half Gaussian distribution I(R), for example, can be obtained from Equation (1) as follows:

$$I(R) = \{\sqrt{2}/(\sqrt{\pi})(\sigma_{10}+\sigma_{20})\}\exp\{-(R-R_m)^2/2\sigma_{10}^2\} \quad (1a)$$
$$\text{(if } R < R_m\text{)}$$
$$= \{\sqrt{2}/(\sqrt{\pi})(\sigma_{10}+\sigma_{20})\}\exp\{-(R-R_m)^2/2\sigma_{10}^2\} \quad (1b)$$
$$\text{(if } R \geq R_m\text{)}$$

where $R_m$ is modal projected range, $\sigma_{10}$ and $\sigma_{20}$ are the standard deviations of two areas to be joined. These parameters are obtained by solving the Equations (2), (3) and (4) given below:

$$R_p = R_m + \sqrt{(2/\pi)}(\sigma_{20}-\sigma_{10}) \quad (2)$$

$$\Delta R_p^2 = \{1-(2/\pi)\}(\sigma_{20}-\sigma_{10})^2 + \sigma_{10}\sigma_{20} \quad (3)$$

$$\gamma \Delta R_p^3 = \sqrt{(2/\pi)}(\sigma_{20}-\sigma_{10})[\{4/\pi)-1\}(\sigma_{20}-\sigma_{10})^2 + \sigma_{10}\sigma_{20}] \quad (4)$$

A computer simulation on a one-dimensional multilayered structure can be performed by utilizing the simulation on a two-layered structure described in "Models for Implantation into Multilayer Targets", H. Ryssel, J. Lorens, and K. Hoffmann, Applied Physics, A41, pages 201 to 207, 1986). One-dimensional impurity distribution C(u) in the direction of depth is obtained by solving Equation (5):

$$C(u) = D_k I\left(u - \sum_{i=1}^{k-1} t_i + \sum_{i=1}^{k-1} (t_i R_{pk}/R_{pi})\right) \quad (5)$$

where u represents the depth from the surface, $t_i$ the thickness of the i-th layer with i=1 indicating the top layer, $D_k$ is the dose at the k-th layer given by a total dose minus a total of doses consumed by the layers above the k-th layer, $R_{pi}$ and $R_{pk}$ indicate the projected ranges of impurities at the i-th and k-th layers, respectively. I(u) is a normalized one-dimensional impurity profile which can be obtained by the following equation using the moments of each semiconductor material:

$$I(u) = \int_{I_{k-1}}^{\infty} I_k(u)du = 1$$

A two-dimensional distribution profile c(x,u) can be obtained by superimposing one-dimensional impurity distributions I(u) by using the complementary error function given by Equation (6) as described in "Handou-Tai Soshi Simulator (Semiconductor Device Simulator)", H. Koike et al., Fuji-Sougou Kenkyujo, Maruzen Publishing Company, Aug. 25, 1991, page 109.

$$C(x,u) = \quad (6)$$
$$C(u)\left[erfc\{(x-x_R)/\sqrt{2}/\sigma_T\} - erfc\{(x-x_L)/\sqrt{2}/\sigma_T\}\right]/2$$

where,
$x_R$=the horizontal coordinate on the right-side boundary of differential mesh;
$x_L$=the horizontal coordinate on the left-side boundary of differential mesh; and
$\sigma_T$=the standard deviation of lateral distribution of impurities.

In FIG. 1, there is shown a computer-implemented simulation method for ion implantation on a flat-top semiconductor substrate of a single-layer structure. As shown in FIG. 1, the simulation method begins with step 11 in which an upper horizontal line 22 (see FIG. 2A) is drawn at a distance $R_p-N\sigma$ from the top (principle) surface 21 of a computer model 20 of the substrate and a lower horizontal line 23 is drawn at a distance $R_p+N\sigma$ from the top surface 21, where $R_p$ is the projected range (because of the single-layer structure, the projected range is equal to the moment $R_p$ of the substrate material), N is a positive integer, typically "3" for the Gaussian distribution, and "10" for the Pearson distribution, and $\sigma$ is the standard deviation of the impurity profile obtained from Equation (3) or from the corresponding moment of the substrate material. Between the lines 22 and 23 is defined a peak region 24 in which the impurity distribution is likely to form a peak (see FIG. 2A).

At step 12, narrowly spaced horizontal parallel lines are drawn within the peak region 24, and widely spaced parallel horizontal parallel lines are drawn outside of the peak region, as shown in FIG. 2B. The vertical spacing of the horizontal parallel lines within the peak region is $\sigma/M$ and the vertical spacing outside the peak region is $\sigma/M'$, where M is greater than M'. The integer M is typically "10" and M' is "1" or "2".

At step 13, vertical parallel lines are drawn such that their horizontal spacing increases as a quadratic function of distance from edges 25 and 26 of a mask, not shown (see FIG. 2C). Therefore, the horizontal spacing of the vertical lines adopts a parabolic curve. In this way, a mesh of an orthogonal coordinate system is defined in a vertical cross-section of the substrate and at each intersection of the mesh an impurity concentration value is defined.

At step 14, a simulation of ion implantation is performed and an impurity profile is obtained by using the values at the intersections of the mesh using Equations (1) to (6).

Since the vertical axis of the coordinate system in the region 24 is defined with narrowly spaced horizontal parallel lines, the peak region of an impurity profile can be precisely calculated regardless of the level of energy with which ions are implanted. On the other hand, the vertical axis of the coordinate system outside of the region 24 is resolved with widely spaced horizontal parallel lines. This low resolution serves to relieve the burden of computations and eliminates the need for a high capacity memory. Note that in an alternative embodiment step 13 may be executed prior to step 12.

Figure 4A:
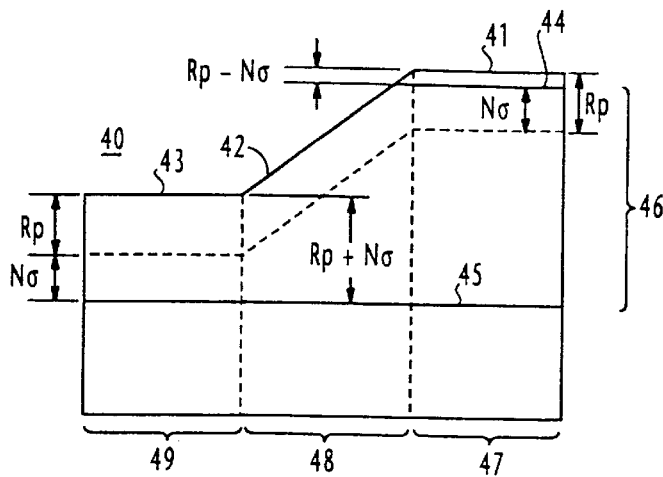
FIGS. 4A to 4C are vertical cross-sections of a computer model of the substrate of FIG. 3.

A second simulation method shown in FIG. 3 is for a nonflat-top semiconductor substrate of single-layer structure. As illustrated in FIG. 4A, a computer model 40 of the substrate has an upper top surface 41, a slope 42 that shelves from surface 41 to a lower top surface 43. The vertical cross-section of the model 40 is divided into a right rectangular section 47 below surface 41, a trapezoidal intermediate section 48 below slope 42 and a left rectangular section 49 below surface 43.

At step 31, an upper horizontal line 44 is drawn at a distance $R_p - N\sigma$ from the upper top surface 41 and a lower horizontal line 45 is drawn at a distance $R_p + N\sigma$ from the lower top surface 43 to define a peak region 46 between lines 44 and 45 (FIG. 4A)

Figure 4B:
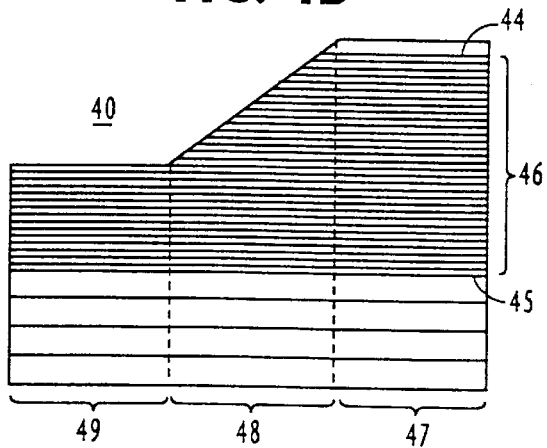

At step 32, narrowly spaced horizontal parallel lines are drawn within the peak region 46 and widely spaced parallel horizontal parallel lines are drawn outside of this peak region (see FIG. 4B). As in the previous embodiment, the vertical spacing of the horizontal lines within the peak region is $\sigma/M$ and the vertical spacing outside the peak region is $\sigma/M'$.

Figure 4C:
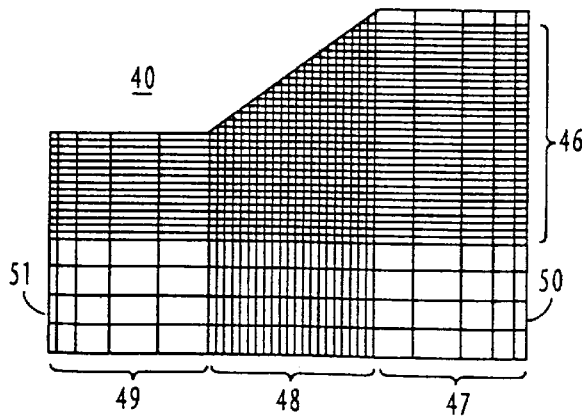

At step 33, a plurality of first vertical parallel lines are drawn within the right rectangular section 47 such that their horizontal spacing increases as a quadratic function of distance from the right edge 50 of a mask (see FIG. 4C), a plurality of second vertical lines are drawn within the left rectangular section 49 such that their horizontal spacing increases as a quadratic function of distance from the left edge 51 of the mask, and a plurality of uniformly spaced vertical parallel lines are drawn within the trapezoidal section 48, thus forming a mesh in a vertical cross-section of a computer model of substrate 40. The spacing of the vertical lines within the trapezoidal section 48 is narrower than the minimum horizontal spacing of the vertical parallel lines in the sections 47 and 49. Specifically, the spacing of the vertical lines of trapezoidal section 48 is $\sigma_T/M_T$, where $M_T$ is a positive integer. An impurity concentration value is then assigned to each intersection of the mesh.

At step 34, a simulation of ion implantation is performed and a distribution of impurity concentrations is obtained by computing the values around the intersections of the mesh using Equations (1) to (6).

A third simulation method shown in FIG. 5 is intended for a nonflat-top semiconductor substrate of partially two-layered structure of silicon and silicon dioxide as shown in FIG. 6A. A computer model 70 of the substrate has an upper top surface 71, a slope 72 that shelves from surface 71 to a lower top surface 73. The vertical cross-section of the model 70 is divided into a two-layer rectangular section 79 below surface 71, a two-layer trapezoidal intermediate section 80 below slope 72 and a single-layer section 81 below surface 73.

At step 61, projected ranges of the multilayered structure are calculated by solving Equation (5) for a single layer structure to obtain an impurity profile and downwardly shifting the profile by an amount $$\sum_{i=1}^{k-1} t_i - \sum_{i=1}^{k-1} (t_i R_{pk} / R_{pi}).$$

A projected range $R_p$ that reaches a k-th layer of a i=1 i=1 multilayered structure is calculated by solving Equation (7) below:

$$R_p = R_{pk} + \sum_{i=1}^{k-1} t_i - \sum_{i=1}^{k-1} (t_i R_{pk} / R_{pi}) \qquad (7)$$

By comparing the $R_p$ value of a given layer with that of the underlying layer, it is determined whether a peak occurs within the given layer or the underlying layer. Calculations of Equation (7) and the comparisons are repeated at several points across the horizontal dimension of the substrate and average values of projected ranges $R_{pa}$, $R_{pb}$, $R_{pc}$ and $R_{pd}$ are obtained at strategic points from surfaces 71, 72 and 73 as indicated in FIG. 6A. Among the average projected ranges, a shallowest point 74 and a deepest point 75 both from the upper top surface 71 are determined (FIG. 6A). In the illustrated example, the shallowest and deepest points 74 and 75 correspond respectively to the projected ranges $R_{pb}$ and $R_{pc}$.

At step 62, a horizontal line 76 is drawn at a distance $R_{pb} - N\sigma_1$ from the upper top surface 71 and a lower horizontal line 77 is drawn at a distance $R_{pc} + N\sigma_2$ from the lower top surface 73 (FIG. 6B) to define a peak region 78 between the lines 76 and 77 within which the profile is likely to form a peak. Note that $\sigma_1$ and $\sigma_2$ are standard deviations of impurity profiles in the horizontal axis of the mesh (orthogonal coordinate system) in the silicon dioxide and silicon layers, respectively.

At step 63, narrowly spaced horizontal parallel lines are drawn within the peak region 78 and widely spaced parallel horizontal parallel lines are drawn outside of this peak region (see FIG. 6C). The vertical spacing of the horizontal parallel lines within the peak region 78 is $\sigma_2/M$ and the vertical spacing outside the peak region is $\sigma_2/M'$.

At step 64, a plurality of first vertical parallel lines are drawn within the left rectangular section 79 such that their horizontal spacing increases as a quadratic function of distance from the left edge 82 of a mask (see FIG. 6D), a plurality of second vertical parallel lines are drawn within the right rectangular section 81 such that their horizontal spacing increases as a quadratic function of distance from the right edge 83 of the mask, and a plurality of uniformly spaced vertical parallel lines are drawn within the trapezoidal section 80. The horizontal spacing of the vertical parallel lines within the trapezoidal section 80 is $\sigma_T/M_T$ which is narrower than the minimum horizontal spacing of vertical parallel lines of sections 79 and 81.

At step 65, a simulation of ion implantation is performed and a distribution of impurity concentrations is obtained by computing the values around the intersections of the mesh using Equations (1) to (6).

What is claimed is:

1. A computer-implemented simulation method for ion implantation into a semiconductor substrate, comprising the steps of:

a) defining a region in a vertical cross-section of the substrate between first and second horizontal lines, said first horizontal line being spaced a distance $R_p-N\sigma$ from a top surface of the substrate and said second horizontal line being spaced a distance $R_p+N\sigma$ from said top surface, where $R_p$ is a projected range of implanted ions from said top surface, N is an integer, and a is a standard deviation of horizontal spread of an impurity profile;

b) forming an orthogonal coordinate system by drawing a plurality of narrowly spaced horizontal parallel lines within said region and a plurality of widely spaced horizontal parallel lines outside of said region and a plurality of vertical parallel lines at spacing which increases as a function of distance from opposite vertical edges of said coordinate system; and c) performing implantation of ions into said substrate through said top surface and determining an impurity profile using said coordinate system.

2. A computer-implemented simulation method as claimed in claim 1, wherein the vertical spacing of the narrowly spaced horizontal parallel lines equals $\sigma M$, where M is an integer.

3. A computer-implemented simulation method as claimed in claim 2, wherein the vertical spacing of the widely spaced horizontal parallel lines equals $\sigma M'$, where M' is an integer smaller than the integer M.

4. A computer-implemented simulation method as claimed in claim 1, wherein the horizontal spacing of the vertical parallel lines varies as a quadratic function of said distance.

5. A computer-implemented simulation method for ion implantation into a single-layer semiconductor substrate having an upper top surface, a slope shelving from the upper top surface to a lower top surface and defining first and second rectangular sections below said upper and lower top surfaces, respectively, and a trapezoidal section below said slope, the method comprising the steps of:

a) defining a region in a vertical cross-section of the substrate between first and second horizontal lines, said first horizontal line being spaced a distance $R_p-N\sigma$ from said upper top surface and said second horizontal line being spaced a distance $R_p+N\sigma$ from said lower top surface, where $R_p$ is a projected range of implanted ions from said top surface, N is an integer, and s is a standard deviation of horizontal spread of an impurity profile;

b) forming an orthogonal coordinate system by drawing a plurality of narrowly spaced horizontal parallel lines within said region and a plurality of widely spaced horizontal parallel lines outside of said region, a plurality of first vertical parallel lines within said first rectangular section at spacing which increases as a function of distance from a vertical edge of said coordinate system, a plurality of second vertical parallel lines within said second rectangular section at spacing which increases as a function of distance from an opposite vertical edge of said coordinate system, and a plurality of third vertical parallel lines within said trapezoidal section at equal spacing; and c) performing implantation of ions into said substrate through said upper top surface, slope and lower top surface and determining an impurity profile using said coordinate system.

6. A computer-implemented simulation method as claimed in claim 5, wherein the vertical spacing of the narrowly spaced horizontal parallel lines equals $\sigma M$, where M is an integer.

7. A computer-implemented simulation method as claimed in claim 6, wherein the vertical spacing of the widely spaced horizontal parallel lines equals $\sigma M'$, where M' is an integer smaller than the integer M.

8. A computer-implemented simulation method as claimed in claim 5, wherein the horizontal spacing of the first vertical parallel lines in said first rectangular section varies as a quadratic function of distance from said edge and the horizontal spacing of the second vertical parallel lines in said second rectangular section varies as a quadratic function of distance from said opposite edge.

9. A computer-implemented simulation method as claimed in claim 5, wherein the spacing of said third vertical parallel lines within said trapezoidal section is narrower than minimum spacing of said first and second vertical parallel lines.

10. A computer-implemented simulation method as claimed in claim 5, wherein the horizontal spacing of the third vertical parallel lines in said trapezoidal section equals $\sigma_T M_T$, where $\sigma_T$ is a standard deviation of impurity profile along the horizontal axis of said coordinate system, and $M_T$ is an integer.

11. A computer-implemented simulation method for ion implantation into a partially multi-layered semiconductor substrate having an upper top surface, a slope shelving from the upper top surface to a lower top surface and defining first and second rectangular sections below said upper and lower top surfaces, respectively, and a trapezoidal section below said slope, said first rectangular section and said trapezoidal section including first and second layers, the method comprising the steps of:

a) defining a region in a vertical cross-section of the substrate between first and second horizontal lines, said first horizontal line being spaced a distance $R_{p1}-N\sigma_1$ from said upper top surface and said second horizontal line being spaced a distance $R_{p2}+N\sigma_2$ from said lower top surface, where $R_{p1}$ is a projected range of implanted ions from said upper top surface, $R_{p2}$ is a projected range of implanted ions from said lower top surface, N is an integer, $\sigma_1$ is a standard deviation of horizontal spread of an impurity profile in said first layer, and $\sigma_2$ is a standard deviation of horizontal spread of the impurity profile in said second layer;

b) forming an orthogonal coordinate system by drawing a plurality of narrowly spaced horizontal parallel lines within said region and a plurality of widely spaced horizontal parallel lines outside of said region, a plurality of first vertical parallel lines within said first rectangular section at spacing which increases as a function of distance from a vertical edge of said coordinate system, a plurality of second vertical parallel lines within said second rectangular section at spacing which increases as a function of distance from an opposite vertical edge of said coordinate system, and a plurality of third vertical parallel lines within said trapezoidal section at equal spacing; and c) performing implantation of ions into said substrate through said upper top surface, slope and lower top surface and determining an impurity profile using said coordinate system.

12. A computer-implemented simulation method as claimed in claim 11, wherein $R_{p1}$ defines a shallowest point from said upper top surface and $R_{p2}$ defines a deepest point from said upper top surface.

13. A computer-implemented simulation method as claimed in claim 11, wherein the vertical spacing of the narrowly spaced horizontal parallel lines equals $\sigma_2 M$, where M is an integer.

14. A computer-implemented simulation method as claimed in claim 13, wherein the vertical spacing of the widely spaced horizontal parallel lines equals $\sigma_2 M'$, where M' is an integer smaller than the integer M.

15. A computer-implemented simulation method as claimed in claim 11, wherein the spacing of said third vertical parallel lines within said trapezoidal section is narrower than minimum spacing of said first and second vertical parallel lines.

16. A computer-implemented simulation method as claimed in claim 11, wherein the horizontal spacing of the first vertical parallel lines in said first rectangular section varies as a quadratic function of distance from said edge and the horizontal spacing of the second vertical parallel lines in said second rectangular section varies as a quadratic function of distance from said opposite edge.

17. A computer-implemented simulation method as claimed in claim 11, wherein the horizontal spacing of the third vertical parallel lines within said trapezoidal section equals $\sigma_T M_T$, where $\sigma_T$ is a standard deviation of impurity profile along the horizontal axis of said coordinate system, and $M_T$ is an integer.

* * * * *

UNITED STATES PATENT AND TRADEMARK OFFICE
CERTIFICATE OF CORRECTION

PATENT NO. : 5,932,881
DATED : August 3, 1999
INVENTOR(S) : Koichi SAWAHATA

It is certified that error appears in the above-identified patent and that said Letters Patent is hereby corrected as shown below:

Column 2, line 9, delete "a" and insert --$\sigma$--.

Column 3, line 48, delete "$2\sigma_{10}^2$" and insert --$2\sigma_{20}^2$--.

Signed and Sealed this

Sixteenth Day of May, 2000

Attest:

Q. TODD DICKINSON

*Attesting Officer*  *Director of Patents and Trademarks*